US010310031B2

(12) United States Patent
Guerin et al.

(10) Patent No.: US 10,310,031 B2
(45) Date of Patent: Jun. 4, 2019

(54) SYSTEM AND METHOD FOR REDUCING SPECIFIC ABSORPTION RATE IN MAGNETIZATION TRANSFER MAGNETIC RESONANCE IMAGING

(71) Applicant: The General Hospital Corporation, Boston, MA (US)

(72) Inventors: Bastien Guerin, Cambridge, MA (US); Lawrence L Wald, Cambridge, MA (US)

(73) Assignee: The General Hospital Corporation, Boston, MA (US)

(*) Notice: Subject to any disclaimer, the term of this patent is extended or adjusted under 35 U.S.C. 154(b) by 176 days.

(21) Appl. No.: 15/342,205

(22) Filed: Nov. 3, 2016

(65) Prior Publication Data
US 2017/0123022 A1 May 4, 2017

Related U.S. Application Data

(60) Provisional application No. 62/250,199, filed on Nov. 3, 2015.

(51) Int. Cl.
*G01R 33/28* (2006.01)
*G01R 33/561* (2006.01)
*G01R 33/56* (2006.01)

(52) U.S. Cl.
CPC ....... *G01R 33/288* (2013.01); *G01R 33/5612* (2013.01); *G01R 33/5605* (2013.01)

(58) Field of Classification Search
CPC .................................................. G01R 33/288
See application file for complete search history.

(56) References Cited

U.S. PATENT DOCUMENTS

| 5,446,384 | A | * | 8/1995 | Dumoulin | .......... | G01R 33/4828 |
| | | | | | | 324/307 |
| 2013/0063143 | A1 | * | 3/2013 | Adalsteinsson | .... | G01R 33/5612 |
| | | | | | | 324/307 |

* cited by examiner

*Primary Examiner* — Jermele M Hollington
*Assistant Examiner* — Feba Pothen
(74) *Attorney, Agent, or Firm* — Quarles & Brady LLP

(57) ABSTRACT

Described here are a system and method for designing radio frequency ("RF") pulses for parallel transmission ("pTx") applications, and particularly pTx applications in magnetization transfer ("MT") magnetic resonance imaging ("MRI"). The concept of "SAR hopping" is implemented using a constrained optimization problem that simultaneously designs multiple RF sub-pulses to maximize power deposition in a bound proton pool while also minimizing local SAR across multiple bound proton pool excitation frequencies. This results in the set of RF waveforms that yield the best excitation profiles for all pulses while ensuring that the local SAR of the average of all pulses is below the regulatory limit imposed by the FDA. Pulses are designed simultaneously while constraining local SAR, global SAR, and peak voltage, explicitly.

18 Claims, 4 Drawing Sheets

SYSTEM AND METHOD FOR REDUCING SPECIFIC ABSORPTION RATE IN MAGNETIZATION TRANSFER MAGNETIC RESONANCE IMAGING

CROSS-REFERENCE TO RELATED APPLICATIONS

This application claims the benefit of U.S. Provisional Patent Application Ser. No. 62/250,199, filed on Nov. 3, 2015, and entitled "SYSTEM AND METHOD FOR REDUCING SPECIFIC ABSORPTION RATE IN MAGNETIZATION TRANSFER MAGNETIC RESONANCE IMAGING."

STATEMENT REGARDING FEDERALLY SPONSORED RESEARCH

This invention was made with government support under EB006847 awarded by the National Institutes of Health. The government has certain rights in the invention.

BACKGROUND OF THE INVENTION

The field of the invention is systems and methods for magnetic resonance imaging ("MRI") and nuclear magnetic resonance ("NMR"). More particularly, the invention relates to systems and methods for designing parallel transmission ("pTx") radio frequency ("RF") pulses for use in saturation of inhomogeneous broad lines in MRI and NMR.

There are many applications of MRI and NMR that require saturation of broad inhomogeneous lines. For example, in NMR "hole burning" experiments are commonly used to measure various properties of liquid and solid samples such as relaxation and molecular motion. In MRI, similar experiments are used, however for very different purpose. An interesting class of MRI experiments that involve saturation of broad inhomogeneous lines is magnetization transfer (MT). In the following we describe in more details the application of the present invention to MT MRI because it is an important application of the present invention and is an important class of experiments that can be used to image a variety of clinically important conditions. However, the invention is not limited to MT imaging using MRI. The invention is applicable to any application that requires saturation of broad inhomogeneous lines, MT imaging and saturation is simply a special case.

In the brain, a significant fraction of the spins in the bound pool are attached to myelin molecules that cover the axon of neurons. Therefore, MT pulses can be used to obtain indirect information about the myelin content of the brain, which is a crucial metric for assessing and staging white matter diseases, such as multiple sclerosis. MT pulses are also used in a recently developed form of spectroscopic imaging developed called chemical exchange saturation transfer ("CEST"). CEST is being investigated by dozens of research groups around the world and has shown promise for the in vivo quantification of pH, ATP concentration, and lactic acid concentration. Thus, CEST has applications for stroke, cancer, and imaging of gene expression via the reporter gene technique. Another clinical application of MT pulses is using them for background suppression techniques. For example, MT-based background suppression is widely used in time-of-flight angiography, which is one of the main applications of clinical MRI.

A significant limitation of saturation pulses, such as those used in MT MRI, is their large power consumption. In MT MRI, the saturation transfer effect is a relatively small effect (i.e., only a small fraction of the energy stored in the bound pool is transferred to the free water pool), so that large amounts of energy need to be "dumped" into the bound pool to detect significant changes in the magnetic resonance image. As a result, MT pulses need to be long and need to have a high amplitude. At ultra-high magnetic fields (e.g., greater than 3 Tesla), the duration and amplitude of these MT pulses cause a major problem of dramatically increasing the specific absorption rate ("SAR"). In hole burning experiments, where the goal is to saturate spectral frequency regions of a broad inhomogeneous lineshape, large saturation amplitudes need to be used as well, which result in large energy deposition in the sample or patient (SAR). SAR is a measure of the energy deposited in the patient by the MRI procedure and is limited by the Food and Drug Administration ("FDA") in the United States. These power limits are too restrictive for MT pulses to be used at ultra-high magnetic fields.

Thus, there remains a need to design MT and saturation pulses that have lower power requirements, such that the MT and saturation pulses can be used at ultra-high magnetic fields without exceeding regulatory or patient safety limits on SAR.

SUMMARY OF THE INVENTION

The present invention overcomes the aforementioned drawbacks by providing a system and method for designing parallel transmission ("pTx") radio frequency ("RF") pulses for use in magnetic resonance imaging ("MRI") applications that minimize the average local specific absorption rate ("SAR"). In general, this is achieved by playing RF pulses across frequencies and designing these RF pulses so that the SAR distribution created by a pulse at a given frequency minimally overlaps with the SAR distribution of pulses at other frequencies, a process that can be referred to as "SAR hopping" between frequencies.

It is an aspect of the invention to provide a method for designing pTx RF pulses for use in MRI. A plurality of resonance frequencies associated with a population of spins having a broad resonance frequency spectrum are selected, and an RF transmission profile is provided for each of a plurality of transmit channels associated with a multichannel RF coil array. A set of compressed SAR matrices at which SAR can be evaluated is selected. A plurality of RF pulses for achieving a desired saturation of the population of spins are then designed by determining a set of RF waveforms that maximize power deposition to the population of spins at the selected resonance frequencies while minimizing an average local SAR of the plurality of RF pulses evaluated at the compressed SAR matrices. The power deposition to the population of spins is determined based on the selected plurality of resonance frequencies and the RF transmission profiles.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
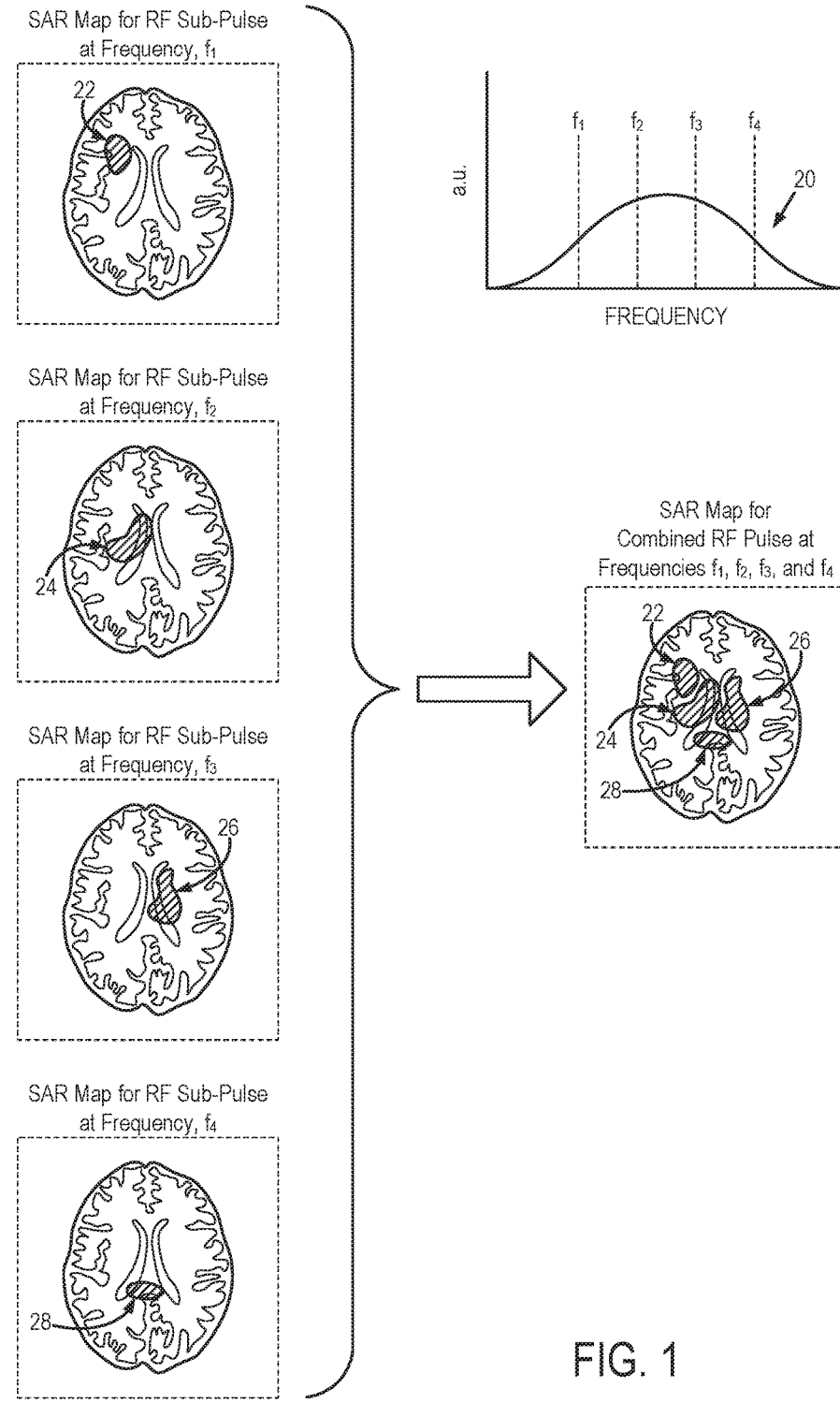
FIG. 1 illustrates an example of specific absorption rate ("SAR") hopping applied along the frequency dimension, in which RF sub-pulses are designed such that the local SAR hotspot generated by each RF sub-pulse at a particular resonance frequency minimally overlaps in space with the local SAR hotspots of other jointly designed RF sub-pulses.

Described here are a system and method for designing radio frequency ("RF") pulses for parallel transmission ("pTx") applications, and particularly pTx applications for applying RF saturation pulses in magnetic resonance imaging ("MRI") to saturate spins with broad resonance frequency spectra. As one example, a population of spins with a broad frequency spectrum can include the pool of proton spins that are bound to large molecules, which is often referred to as the "bound proton pool." The present invention thus provides a system and method for reducing the significant power demands of RF saturation pulses, such as magnetization transfer ("MT") pulses.

In magnetization transfer applications, instead of exciting the main water signal (the "free water pool"), MT pulses excite the bound proton pool. The spins of the bound pool relax with a time constant that is very short, and therefore are not detectable using conventional MRI. As a consequence, these spins do not contribute directly to the magnetic resonance image. Instead, they contribute indirectly to the image via the magnetization transfer effect. This effect transfers a small portion of the energy stored in the bound pool to the spins in the free water pool. Therefore, when implementing magnetization transfer, the magnetic resonance image is affected by the spins in the bound pool, even though the bound pool spins are not directly detected or imaged.

The present invention implements a specific absorption rate ("SAR") hopping concept in which the RF saturation pulse is decomposed into several sub-pulses exciting multiple frequencies. The different sub-pulses are jointly designed by an optimization procedure in order to minimize the overlap of their SAR distribution in the frequency dimension, thereby reducing the local SAR of the total RF saturation pulse. By using these optimized RF saturation pulses with pTx, the SAR of the RF saturation pulses can be reduced. This in turns allows creation of more desirable image contrast at constant local SAR, or the creation of the same image contrast at lower SAR levels, which is safer for the patient. As one example, the RF pulses can be used in magnetization transfer applications and the image contract can be magnetization transfer contrast. The optimized RF saturation pulses optimally balance the competing requirements of good saturation (e.g., saturation of the bound proton pool for magnetization transfer applications) and safety of the experiment by strict enforcement of the SAR limits set by the FDA.

The systems and methods described here are generally based on the recognition that the main limit of MT and other RF saturation pulses at high fields is local SAR (i.e., the peak SAR value across the patient's body) and not global SAR (i.e., the average of SAR over the whole body). Although it is difficult to decrease global SAR, local SAR can be effectively decreased using pTx techniques. Thus, by appropriately designing RF saturation pulses for pTx, the local SAR of the RF saturation pulses can be reduced. It is noted that global SAR can also be reduced using the techniques described here; however, the gains in doing so are less pronounced in global SAR than in local SAR.

The present invention includes two different pTx RF pulse design strategies that allow for the reduction of local SAR in RF saturation pulses. The first design strategy is to constrain local SAR explicitly in the pulse design process. This constraint is achieved by compressing the SAR matrices at every location in the body to a much smaller set of compressed SAR matrix points, which may be virtual observation points ("VOPs").

The second design strategy, mentioned above, is to simultaneously design multiple pulses that have cancelling SAR hotspot locations across multiple frequencies (e.g., different excitation frequencies for the bound proton pool in magnetization transfer applications). This design constraint may be referred to as "SAR hopping" because it allows SAR hotspots to "hop" to different spatial locations from pulse to pulse (i.e., such that a SAR hotspot for one frequency minimally overlaps in space with the SAR hotspots for other frequencies). An example of this is illustrated in FIG. 1, which shows SAR maps for four RF sub-pulses, each depositing energy at different frequencies $f_1$, $f_2$, $f_3$, and $f_4$ across a broad resonance spectrum 20, and a SAR map for a composite RF pulse composed of the RF sub-pulses. The RF sub-pulses are designed to generate a local SAR hot spot 22, 24, 26, 28 at different spatial locations, such that when the sub-pulses are simultaneously generated as a composite RF pulse, there is minimal overlap of the local SAR hotspots 22, 24, 26, 28.

The SAR hopping concept is framed as an optimization problem over the RF waveforms of all sub-pulses simultaneously, while explicitly constraining the local SAR of the average of all the sub-pulses. In other words, multiple RF waveforms are designed such that they minimize the overall mean square error of all sub-pulses while constraining the average local SAR of these pulses to be below a defined regulatory or safety limit. In some embodiments, the global SAR can also be constrained.

Thus, in general, the RF saturation pulse design process described here includes computing SAR matrices in every voxel of a body model and using an optimization algorithm to design RF saturation pulses that apply the maximum amount of energy possible across a desired broad resonance spectrum (e.g., in the bound proton pool) while satisfying local SAR and global SAR limits. Specifically, a pTx coil that has multiple transmit channels for RF transmission can be used. These channels are driven by RF waveforms that achieve optimal energy deposition in the bound proton pool while satisfying safety or regulatory constraints on local and global SAR. Additional constraints, such as the peak power and the average power utilized by every transmit channel of the RF coil array, and in average for the entire coil (sum over all channels), can also be included in the optimization process.

A further reduction of the local SAR (or equivalently, increase of the bound proton pool saturation at constant local SAR) can be obtained using a SAR hopping concept applied to the frequency dimension. In magnetization transfer applications, SAR hopping can be implemented by designing RF pulses that deposit energy in the bound proton pool at different frequencies instead of a single frequency (as is traditionally done). These frequencies may be far apart (e.g., kHz apart) or close together (e.g., 0.1 kHz apart) depending on the application.

As one example, in a CEST experiment, two or three SAR hopping frequencies spaced close together in the frequency dimension may be used so as not to degrade the spectral resolution of the CEST absorption curve (i.e., the so-called "z-spectrum"). On the other hand, in a MT contrast experiment, SAR hopping frequencies may be chosen to be far apart to maximally decrease local SAR and, therefore, to increase MT contrast. SAR hopping is also compatible with an asymmetric MT technique by choosing closely spaced SAR hopping frequencies on either side of the free water peak frequency spectrum.

SAR hopping in the frequency dimension works because the SAR maps of RF saturation sub-pulses at different frequencies are independent. The SAR of the total RF saturation pulse is therefore the sum of the SAR maps of the different sub-pulse frequencies. As a consequence, the local SAR hotspots of the SAR maps at the different frequencies can be "moved around" in space to decrease the local SAR of the total RF saturation pulse. This process is referred to as "SAR hopping" because the maximum local SAR is moved around to different spatial locations for each of the different frequencies. This design technique can be implemented by joining optimization of the RF saturation sub-pulses at all frequencies simultaneously while enforcing constraints on the local SAR of the total RF saturation pulse (as opposed to enforcing local SAR limits on the individual MT saturation frequencies).

As will now be described in more detail, the present invention explicitly controls local SAR and can control other parameters, such as global SAR, peak voltage, and average power, on every transmit channel simultaneously. Local SAR is also controlled in the entire body by compressing the SAR matrices at every location into a dramatically smaller set of compressed SAR matrix points. The present invention does not depend on regularization parameters that indirectly control tradeoffs between SAR, power, and fidelity; instead, it explicitly enforces the global and local SAR as well as power limits. This simplifies the task of the operator and is contemplated to improve image quality by automatically finding optimal tradeoffs between local SAR, global SAR, and peak power, as well as excitation fidelity and MT contrast.

When using several transmit channels to excite a magnetic resonance signal, SAR at location, r, is computed from the knowledge of the electric fields $E_1(r), \ldots, E_C(r)$ created by the C transmit channels; the RF waveforms played on each of these channels; the conductivity, $\sigma(r)$; and the density $\rho(r)$, according to the following:

$$SAR(r) = \frac{\sigma(r)}{2\rho(r)} \frac{1}{T} \int_0^T \left\| \sum_{c=1}^{C} E_c(r, t) \right\|^2 dt; \quad (1)$$

which can be approximated as $$SAR(r) \approx \frac{\sigma(r)}{2\rho(r)} \frac{1}{N} \sum_{n=1}^{N} rf(n\Delta t)^H Q(r) rf(n\Delta t). \quad (2)$$

In Eqn. (2), $rf(n\Delta t)$ is the vertical concatenation of RF values played on all channels at time $n\Delta t$; $\{\ldots\}^H$ indicates the Hermitian transpose operator; T is the pulse length; N is the number of RF samples; and Q(r) is the correlation matrix of electric fields created by all channels at the location, r. SAR averaging over a given volume (e.g., a ten gram or one gram volume) as prescribed by the FDA can be done at the level of the correlation matrices, Q(r), by summing the original matrices contained in the averaging volume. Eqn. (2) is thus valid even when performing SAR averaging. The material properties and other constants are incorporated in the definition of the matrix, Q(r) to simplify notations.

In theory, explicit control for local SAR in the design of MT pulses should be performed by controlling SAR at every position, r, of the body model used to compute the electric fields. For the averaging process to be reasonably accurate, at least 50 Q-matrices would need to be summed, which means that the linear resolution of the body model would need to be one the order of 2.7 mm (5.8 mm). At these resolutions, typical body models contain hundreds of thousands of voxels. Controlling SAR at so many locations would make the pulse design process extremely slow and, therefore, not applicable in the clinic. To address this problem, the methods described here control SAR in the entire body using a compression of the original SAR matrices, SAR(r), to reduce the number of evaluation points.

By way of example, one method for compressing the SAR matrices, SAR(r), can include forming a significantly smaller set of virtual observation points ("VOPs"). The compression of the SAR matrices, SAR(r), can be carried out as described by G. Eichfelder and M. Gebhardt in "Local specific absorption rate control for parallel transmission by virtual observation points," *Magnetic Resonance in Medicine*, 2011; 66(5): 1468-1476. The VOP compression scheme allows for the reduction of the number of SAR matrices by a factor of 300 or more, while ensuring that the local SAR estimation error associated with the compression process is an overestimation. The safety margin afforded by this overestimation is a beneficial feature of the algorithm.

Another example of how the SAR matrices, SAR(r) can be compressed is to use the compression method described by A. Sbrizzi, et al., in "Fast design of local N-gram specific absorption rate-optimized radiofrequency pulses for parallel transmit systems," *Magnetic Resonance in Medicine*, 2012; 67(3):824-834. Unlike the VOP method, this compression technique does not guarantee that the SAR error is an overestimation. Although the succeeding description is provided with respect to using VOPs, it will be appreciated by those skilled in the art that the VOPs can be readily exchanged with other compressed samplings of the SAR matrices, SAR(r).

Other popular model reduction methods, like truncated SVD, could be used to reduce the number of SAR matrices, but these methods typically result in local SAR estimation errors that are sometime positive and sometime negative. That is, in some cases these methods underestimate local SAR, which is potentially harmful to the patient. The local SAR overestimation error associated with the VOP compression scheme is bounded by a user-defined maximum allowed error that indirectly controls the number of VOPs. A tight control of local SAR thus requires more VOPs than a loose one.

As described above, local SAR can be reduced by designing multiple MT sub-pulses that have their SAR hotspots at different locations and frequencies. This idea is implemented as an optimization problem in which multiple sub-pulses are designed simultaneously such that the power provided to the bound proton pool is maximized while the local SAR of the average of all the sub-pulses is constrained explicitly using compressed SAR matrix points, such as VOPs, $$\max_{x} \|FA(x)\|_2^2; \qquad (3)$$

where x is the concatenation of the RF waveforms associated with the MT sub-pulses, which are simultaneously designed. The flip angle, $FA(x)$, can be defined as, $$FA(x) = \gamma \Delta t \sum_{n=1}^{N} \sum_{c=1}^{C} \sum_{f=1}^{F} B_{1+,c}(x) x_{c,n,f}; \qquad (4)$$

where $\gamma$ is a gyromagnetic ratio; $c=1, \ldots, C$ is the number of pTx channels; $n=1, \ldots, N$ is the number of time points in each RF waveform; $f=1, \ldots, F$ is the number of frequencies; and $B_{1+,c}(x)$ is the B1+ transmit profile of the $c^{th}$ transmit channel.

The optimization problem of Eqn. (3) is constrained by the following constraints:

$$\frac{1}{NF} \sum_{n=1}^{N} x_{n,f}^H VOP_i x_{n,f} \le SAR_{local} \ \forall \ i; \qquad (5)$$

$$\frac{1}{NF} \sum_{n=1}^{N} x_{n,f}^H \langle Q \rangle x_{n,f} \le SAR_{global}; \qquad (6)$$

$$|x_{c,n,f}|^2 \le V_{peak}; \qquad (7)$$

and $$\frac{1}{NF} \sum_{n=1}^{N} |x_{c,n,f}|^2 \le P_{avg}. \qquad (8)$$

In Eqn. (5), $VOP_i$ is the $i^{th}$ virtual observation point. When a SAR compression method other than the VOP method is used, the compressed SAR matrix samplings will replace the $VOP_i$ terms in Eqn. (5).

These foregoing constraints can be described as follows: Eqn. (5) constrains local SAR at every compressed SAR matrix point over the frequencies $f=1, \ldots, F$; Eqn. (6) constrains global SAR; and Eqn. (8) constrains peak voltage for each channel. As described above, the local SAR of the average of all pulses is being constrained in the present invention, and not the local SAR of each pulse individually. In doing so, the SAR hopping concept is enforced as a constraint in the pulse design process.

The optimization problem in Eqn. (3) subject to the constraints of Eqns. (5)-(8) is convex. Notably, the least squares objective is convex and the constraints define a convex set because all SAR matrices are semi-definite positive. To solve this optimization problem, a primal/dual interior point algorithm, such as the one described by S. P. Boyd and L. Vandenberghe in *Convex Optimization* (Cambridge Univ. Press, 2004) can be used. It is noted that different objective functions than the objective function in Eqn. (3) can also be used in the optimization process. In general, the objective function that is used can be related to the flip angle of the total energy deposited in the desired resonance spectrum (e.g., the broad spectrum associated with the bound proton pool). In magnetization transfer applications, it is contemplated that the objective function can incorporate a more detailed modeling of the time dynamics of the magnetization transfer exchange between bound and free proton pools.

Figure 2:
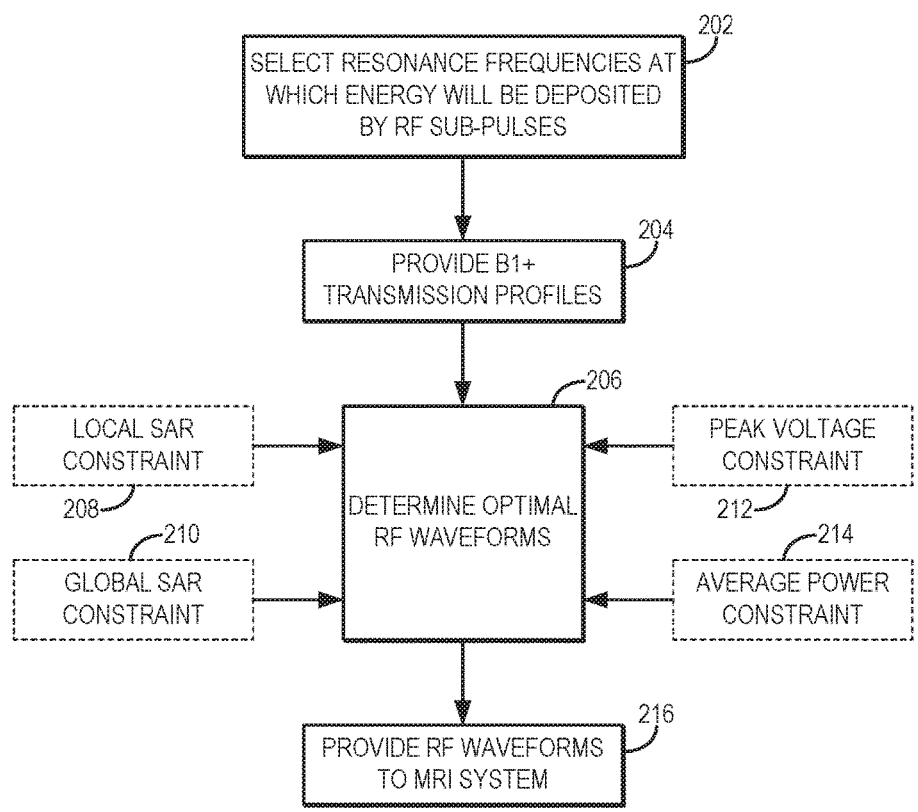
FIG. 2 is a flowchart setting forth the steps of an example method for designing RF pulses for use in magnetization transfer applications.

Referring now to FIG. 2, a flowchart is illustrated as setting forth the steps of an example method for designing RF sub-pulses collectively defining an RF saturation pulse for use in MRI. The method begins with the selection of resonance frequencies at which the multiple sub-pulses will deposit energy, as indicated at step 202. Information about the B1+ transmission profile for the multichannel RF coil is also provided, as indicated at step 204. As one example, the B1+ transmission profiles can be measured or otherwise estimated based on data acquired with the MRI system. As another example, the B1+ transmission profiles can be provided by retrieving previously generated profiles from data storage.

Using the selected frequencies and the B1+ transmission profile information, a set of optimal RF waveforms is determined, as indicated at step 206. Preferably, these RF waveforms are determined using the optimization problem set forth in Eqn. (3), or a suitable alternative as described above. This optimization is constrained using one or more of the following constraints: a local SAR constraint, as indicated at 208 and described above in Eqn. (5); a global SAR constraint, as indicated at 210 and described above in Eqn. (6); a peak voltage constraint, as indicated at 212 and described above in Eqn. (7); and an average power constraint, as indicated at 214 and described above in Eqn. (8). It is noted again that the local SAR constraint 208 is a constraint on the average local SAR attributable to all of the simultaneously designed RF sub-pulses, and not the local SAR attributable to each RF sub-pulse in isolation. This constraint thus automatically enforces the SAR hopping concept described above. In addition, it is noted that the local SAR constraint 208 and the global SAR constraint 210 are assessed at compressed SAR matrix points, which may be VOPs, thereby reducing the computational complexity of the RF design process.

The method thus proceeds by providing the determined optimal RF waveforms to an MRI system, as indicated at step 216. The MRI system is then capable of employing these RF waveforms to produce pTx RF pulses for magnetization transfer applications.

Figure 3:
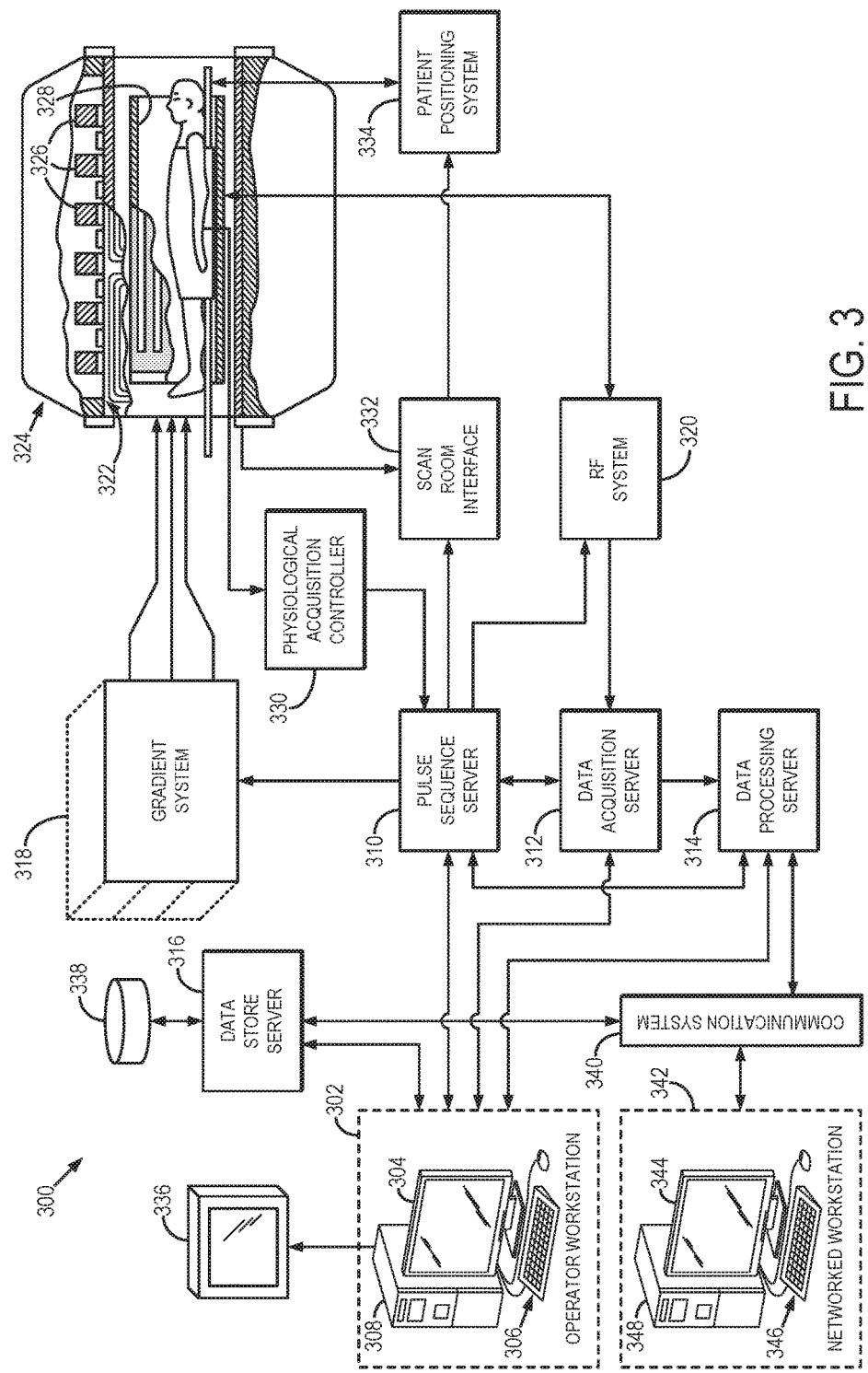
FIG. 3 is a block diagram of an example of a magnetic resonance imaging ("MRI") system.

Referring particularly now to FIG. 3, an example of a magnetic resonance imaging ("MRI") system 300 is illustrated. The MRI system 300 includes an operator workstation 302, which will typically include a display 304; one or more input devices 306, such as a keyboard and mouse; and a processor 308. The processor 308 may include a commercially available programmable machine running a commercially available operating system. The operator workstation 302 provides the operator interface that enables scan prescriptions to be entered into the MRI system 300. In general, the operator workstation 302 may be coupled to four servers: a pulse sequence server 310; a data acquisition server 312; a data processing server 314; and a data store server 316. The operator workstation 302 and each server 310, 312, 314, and 316 are connected to communicate with each other. For example, the servers 310, 312, 314, and 316 may be connected via a communication system 340, which may include any suitable network connection, whether wired, wireless, or a combination of both. As an example, the communication system 340 may include both proprietary or dedicated networks, as well as open networks, such as the internet.

The pulse sequence server 310 functions in response to instructions downloaded from the operator workstation 302 to operate a gradient system 318 and a radiofrequency ("RF") system 320. Gradient waveforms necessary to perform the prescribed scan are produced and applied to the gradient system 318, which excites gradient coils in an assembly 322 to produce the magnetic field gradients $G_x$, $G_y$, and $G_z$ used for position encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil (not shown in FIG. 3), in order to perform the prescribed magnetic resonance pulse sequence. Responsive magnetic resonance signals detected by the RF coil 328, or a separate local coil (not shown in FIG. 3), are received by the RF system 320, where they are amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the scan prescription and direction from the pulse sequence server 310 to produce RF pulses of the desired frequency, phase, and pulse amplitude waveform. The generated RF pulses may be applied to the whole-body RF coil 328 or to one or more local coils or coil arrays (not shown in FIG. 3).

The RF system 320 also includes one or more RF receiver channels. Each RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \quad (9);$$

and the phase of the received magnetic resonance signal may also be determined according to the following relationship:

$$\varphi = \tan^{-1}\left(\frac{Q}{I}\right). \quad (10)$$

The pulse sequence server 310 also optionally receives patient data from a physiological acquisition controller 330. By way of example, the physiological acquisition controller 330 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 310 to synchronize, or "gate," the performance of the scan with the subject's heart beat or respiration.

The pulse sequence server 310 also connects to a scan room interface circuit 332 that receives signals from various sensors associated with the condition of the patient and the magnet system. It is also through the scan room interface circuit 332 that a patient positioning system 334 receives commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, such that no data is lost by data overrun. In some scans, the data acquisition server 312 does little more than pass the acquired magnetic resonance data to the data processor server 314. However, in scans that require information derived from acquired magnetic resonance data to control the further performance of the scan, the data acquisition server 312 is programmed to produce such information and convey it to the pulse sequence server 310. For example, during prescans, magnetic resonance data is acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also be employed to process magnetic resonance signals used to detect the arrival of a contrast agent in a magnetic resonance angiography ("MRA") scan. By way of example, the data acquisition server 312 acquires magnetic resonance data and processes it in real-time to produce information that is used to control the scan.

The data processing server 314 receives magnetic resonance data from the data acquisition server 312 and processes it in accordance with instructions downloaded from the operator workstation 302. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 314 are conveyed back to the operator workstation 302 where they are stored. Real-time images are stored in a data base memory cache (not shown in FIG. 3), from which they may be output to operator display 302 or a display 336 that is located near the magnet assembly 324 for use by attending physicians. Batch mode images or selected real time images are stored in a host database on disc storage 338. When such images have been reconstructed and transferred to storage, the data processing server 314 notifies the data store server 316 on the operator workstation 302. The operator workstation 302 may be used by an operator to archive the images, produce films, or send the images via a network to other facilities.

The MRI system 300 may also include one or more networked workstations 342. By way of example, a networked workstation 342 may include a display 344; one or more input devices 346, such as a keyboard and mouse; and a processor 348. The networked workstation 342 may be located within the same facility as the operator workstation 302, or in a different facility, such as a different healthcare institution or clinic.

The networked workstation 342, whether within the same facility or in a different facility as the operator workstation 302, may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may be exchanged between the data processing server 314 or the data store server 316 and the networked workstations 342, such that the data or images may be remotely processed by a networked workstation 342. This data may be exchanged in any suitable format, such as in accordance with the transmission control protocol ("TCP"), the internet protocol ("IP"), or other known or suitable protocols.

Figure 4:
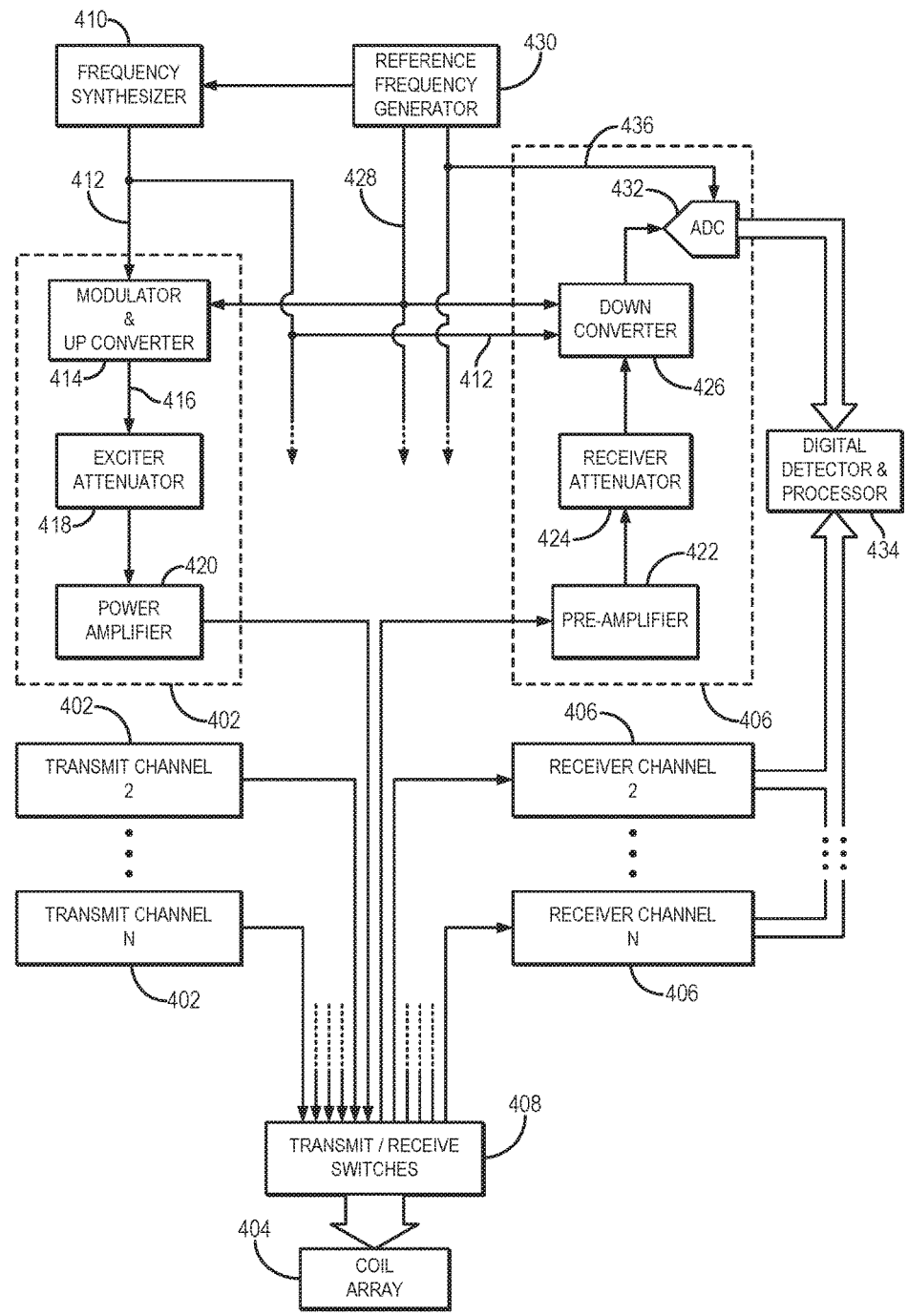
FIG. 4 is a block diagram of an example of a parallel transmit and receive RF system that can form a part of the MRI system of FIG. 3.

Referring particularly to FIG. 4, the RF system 320 includes one or more transmit channels 402 that produce a prescribed RF excitation field. The base, or carrier, frequency of this RF excitation field is produced under control of a frequency synthesizer 410 that receives a set of digital signals from the pulse sequence server 310. These digital signals indicate the frequency and phase of the RF carrier signal produced at an output 412. The RF carrier is applied to a modulator and up converter 414 where its amplitude is modulated in response to a signal, R(t), also received from the pulse sequence server 310. The signal, R(t), defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 416 may be attenuated by an exciter attenuator circuit 418 that receives a digital command from the pulse sequence server 310. The attenuated RF excitation pulses are then applied to a power amplifier 420 that drives the RF coil array 404.

The MR signal produced by the subject is picked up by the RF coil array 402 and applied to the inputs of the set of receiver channels 406. A preamplifier 422 in each receiver channel 406 amplifies the signal, which is then attenuated by a receiver attenuator 424 by an amount determined by a digital attenuation signal received from the pulse sequence server 310. The received signal is at or around the Larmor frequency, and this high frequency signal is down converted in a two step process by a down converter 426. The down converter 426 first mixes the MR signal with the carrier signal on line 412 and then mixes the resulting difference signal with a reference signal on line 428 that is produced by a reference frequency generator 430. The down converted MR signal is applied to the input of an analog-to-digital ("A/D") converter 432 that samples and digitizes the analog signal. As an alternative to down conversion of the high frequency signal, the received analog signal can also be detected directly with an appropriately fast analog-to-digital ("A/D") converter and/or with appropriate undersampling. The sampled and digitized signal is then applied to a digital detector and signal processor 434 that produces 16-bit in-phase (I) values and 16-bit quadrature (Q) values corresponding to the received signal. The resulting stream of digitized I and Q values of the received signal are output to the data acquisition server 312. In addition to generating the reference signal on line 428, the reference frequency generator 430 also generates a sampling signal on line 436 that is applied to the A/D converter 432.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for designing parallel transmission (pTx) radio frequency (RF) pulses for use in magnetic resonance imaging (MRI), the steps of the method comprising:
    (a) selecting a plurality of resonance frequencies associated with a population of spins having a broad resonance frequency spectrum, wherein the population of spins is associated with a bound proton pool;
    (b) providing an RF transmission profile for each of a plurality of transmit channels associated with a multichannel RF coil array;
    (c) selecting a set of compressed specific absorption rate (SAR) matrices at which SAR can be evaluated;
    (d) designing a plurality of RF pulses for achieving a desired saturation of the population of spins by determining a set of RF waveforms that maximize power deposition to the population of spins at the selected resonance frequencies while minimizing an average local SAR of the plurality of RF pulses evaluated at the compressed SAR matrices, wherein the power deposition to the population of spins is determined based on the selected plurality of resonance frequencies and the RF transmission profiles.

2. The method as recited in claim 1, wherein the average local SAR is evaluated across the plurality of resonance frequencies.

3. The method as recited in claim 1, wherein step (d) includes maximizing a flip angle of the plurality of RF pulses.

4. The method as recited in claim 1, wherein the selected set of compressed SAR matrices define a sparse sampling of SAR matrices.

5. The method as recited in claim 1, wherein step (d) includes minimizing the average local SAR of the plurality of RF pulses evaluated at the compressed SAR matrices using a constraint defined as, $$\frac{1}{NF}\sum_{n=1}^{N} x_{n,f}^{H} VOP_i x_{n,f} \leq SAR_{local} \ \forall \ i;$$

wherein $x_{n,f}$ is a vector including a concatenation of the RF waveforms evaluated at sample points for each of the plurality of resonance frequencies; $\{\ldots\}^H$ indicates a Hermitian transpose operation; $VOP_i$ is a compressed SAR matrix point; N is a number of sample points in the concatenation of the RF waveforms; F is the number of selected resonance frequencies, and $SAR_{local}$ is a local SAR threshold.

6. The method as recited in claim 1, wherein the set of RF waveforms determined in step (d) also minimize a global SAR of each RF pulse evaluated at the compressed SAR matrices.

7. The method as recited in claim 1, wherein the set of RF waveforms determined in step (d) also minimize a peak voltage in each of the transmit channels.

8. The method as recited in claim 1 in which the set of RF waveforms determined in step (d) also minimize a global SAR of each RF pulse evaluated at the compressed SAR matrices and a peak voltage in each of the transmit channels.

9. The method as recited in claim 1, wherein step (c) includes selecting the set of compressed SAR matrices using a method that defines the compressed SAR matrices as virtual observation points (VOPs).

10. The method as recited in claim 1, wherein providing the RF transmission profile for each of a plurality of transmit channels includes estimating each RF transmission profile from data acquired with the MM system.

11. A magnetic resonance imaging (MM) system, comprising:
    a magnet system configured to generate a polarizing magnetic field about at least a portion of a subject arranged in the MRI system;

a plurality of gradient coils configured to apply at least one magnetic gradient field to the polarizing magnetic field;

a radio frequency (RF) system including a multichannel RF coil array configured to apply an RF field to the subject and to receive magnetic resonance signals therefrom;

a computer system programmed to:
select a plurality of resonance frequencies associated with a population of spins having a broad resonance frequency spectrum;
provide an RF transmission profile for each of a plurality of transmit channels associated with the multichannel RF coil array;
select a set of compressed specific absorption rate (SAR) matrices at which SAR can be evaluated;
design a plurality of RF pulses for achieving a desired magnetization transfer effect by determining a set of RF waveforms that maximize power deposition to the population of spins while minimizing an average local SAR of the plurality of RF pulses evaluated at the compressed SAR matrices, wherein the power deposition to the population of spins is determined based on the selected plurality of resonance frequencies and the RF transmission profiles; and
direct the RF system to produce the plurality of RF pulses using the determined set of RF waveforms, such that a desired saturation effect is generated in the population of spins.

12. The MRI system as recited in claim 11, wherein the population of spins is associated with a bound proton pool.

13. The MRI system as recited in claim 11, wherein the computer system is programmed to select the set of compressed SAR matrices to define a sparse sampling of SAR matrices.

14. The MRI system as recited in claim 13, wherein the computer system is programmed to compute the compressed SAR matrices as virtual observation points (VOPs).

15. The MRI system as recited in claim 14, wherein the computer system is programmed to determine the set of RF waveforms by minimizing the average local SAR of the plurality of RF pulses evaluated at the compressed SAR matrices using a constraint defined as, $$\frac{1}{NF}\sum_{n=1}^{N} x_{n,f}^{H} VOP_i x_{n,f} \le SAR_{local} \; \forall \; i;$$

wherein $x_{n,f}$ is a vector including a concatenation of the RF waveforms evaluated at sample points for each of the plurality of resonance frequencies; $\{\ldots\}^H$ indicates a Hermitian transpose operation; $VOP_i$ is a virtual observation point; N is a number of sample points in the concatenation of the RF waveforms; F is the number of selected resonance frequencies, and $SAR_{local}$ is a local SAR threshold.

16. The MRI system as recited in claim 11, wherein the computer system is configured to determine the set of RF waveforms that also minimize a global SAR of each RF pulse evaluated at the compressed SAR matrices.

17. The MRI system as recited in claim 11, wherein the computer system is configured to determine the set of RF waveforms that also minimize a peak voltage in each of the transmit channels.

18. The MRI system as recited in claim 11, wherein the computer system is configured to determine the set of RF waveforms that also minimize a global SAR of each RF pulse evaluated at the compressed SAR matrices and a peak voltage in each of the transmit channels.

* * * * *